United States Patent [19]

Snyder et al.

[11] Patent Number: 4,511,869
[45] Date of Patent: Apr. 16, 1985

[54] RADIO CIRCUIT TUNED BY ADJUSTABLY DEFORMING AN INDUCTANCE COIL

[75] Inventors: Daniel S. Snyder, Norwalk; Timothy C. Benincasa, Bellevue, both of Ohio

[73] Assignee: Imperial Clevite Inc., Glenview, Ill.

[21] Appl. No.: 466,428

[22] Filed: Feb. 15, 1983

[51] Int. Cl.³ .............................................. H03J 7/30
[52] U.S. Cl. ...................................... 334/20; 334/46; 334/71; 336/20
[58] Field of Search ....................... 334/20, 21, 46, 44, 334/71, 5; 324/78 Z; 333/17 R, 17 M; 336/20; 455/120, 121, 123, 125; 340/58

[56] References Cited

U.S. PATENT DOCUMENTS

| | | | |
|---|---|---|---|
| 2,410,222 | 10/1946 | Lawrence, Jr. | 334/44 |
| 2,511,580 | 6/1950 | Goodrich | 334/20 X |
| 2,624,042 | 12/1952 | Loe | 336/20 |
| 2,857,519 | 10/1958 | Gaskill et al. | 334/21 |
| 2,877,351 | 3/1959 | Sacre | 334/21 |
| 3,590,385 | 6/1971 | Sabo et al. | 455/123 |
| 4,234,960 | 11/1980 | Spilsbury et al. | 334/20 X |
| 4,272,743 | 6/1981 | Evans | 333/17 R X |

Primary Examiner—Eugene R. Laroche
Assistant Examiner—Benny T. Lee
Attorney, Agent, or Firm—Russell E. Baumann

[57] ABSTRACT

A system and method for adjusting the frequency of operation of a radio frequency circuit including an inductive loop having an adjustable exposed inductor portion is provided. The frequency of operation of the circuit is first detected with means for detecting a parameter relating to and representing the frequency of operation. The adjustable inductor portion is associated with a selectively movable actuator device coupled to the frequency detecting means and a source of signals representing a predetermined frequency of operation for the circuit. A control circuit means, preferably a computer, is coupled to the detecting means and to the source of signals to provide an output control signal when the detected frequency of operation bears a predetermined relationship to the predetermined frequency of operation. The control signal operates the actuator device to adjust the configuration of the exposed inductor portion by moving the actuator device whereby the inductance of the inductive loop and the frequency of operation are associatively varied. The configuration of the inductor portion is fixed at a position of adjustment determining the frequency of operation to be at the predetermined frequency.

5 Claims, 5 Drawing Figures

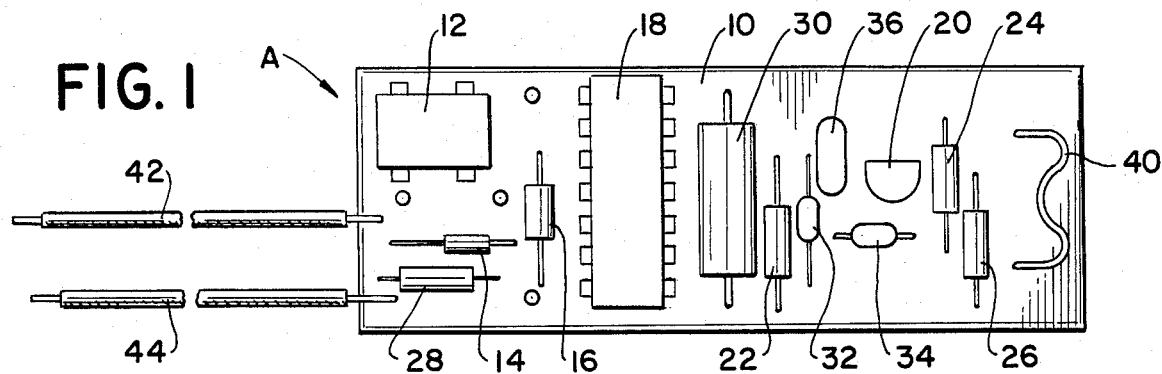
FIG. 1
FIG. 5
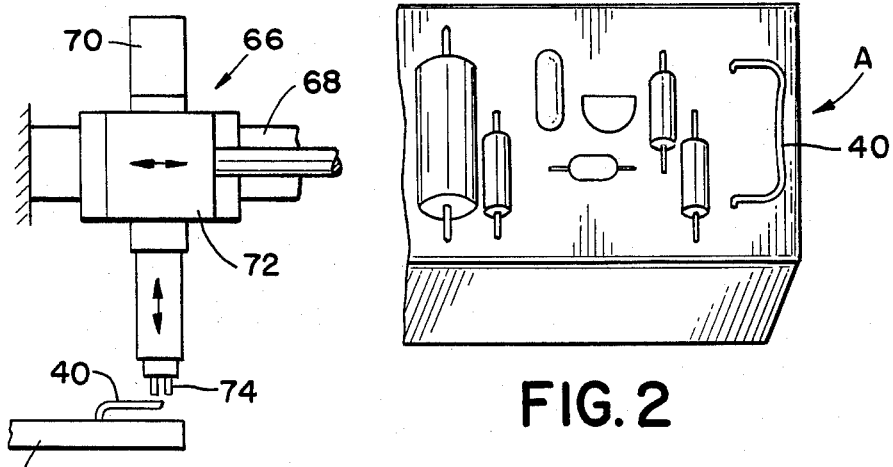
FIG. 2
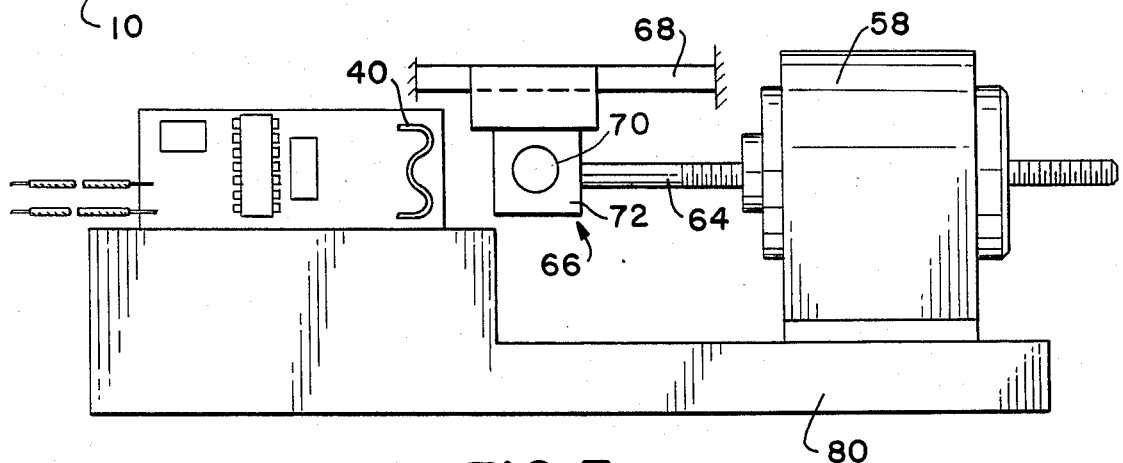
FIG. 3
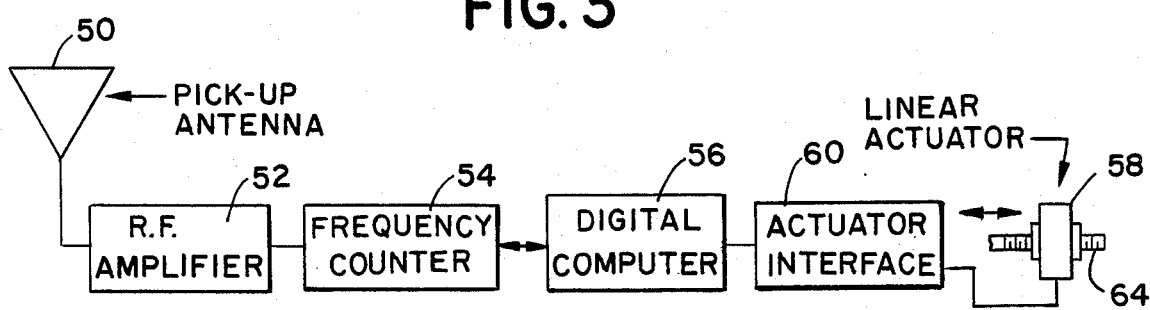
FIG. 4

RADIO CIRCUIT TUNED BY ADJUSTABLY DEFORMING AN INDUCTANCE COIL

BACKGROUND OF THE INVENTION

This invention pertains to the art of raio devices and particularly to radio frequency circuitry including adjustable tuners.

The invention is applicable to a radio frequency transmitter for transmitting very stable high frequency transmissions and, more particularly, to a radio transmitter to be used in an extremely hazardous and inaccessible location, such as the wheel of an automobile, which will subject the circuit to extreme shock, vibration, temperature and pressure and yet maintain operation at the tuned frequency. Such a circuit may be advantageously employed in conjunction with a low tire warning system as is disclosed in U.S. Pat. No. 4,237,728. However, it will be appreciated by those skilled in the art that the invention can be readily adapted for use in other application, environments or locations as, for example, where similar radio devices are employed in other types of areas.

Since the radio circuit is to be used in such a harsh environment, and after installation will be relatively inaccessible for maintenance and retuning, it is especially desirous to have a radio circuit which is particularly sturdy and that will maintain the necessary tight frequency stability. The circuit will also involve a relatively low level power supply and accordingly only a low level power transmission may be made to a fairly closely positioned radio receiver. It is a further requirement of the invention that the circuit be dimensioned for ready attachment in a wheel rim cavity of an automobile wheel.

The various forms and types of tunable radio circuits that have been suggested for use in an automobile tire in association with a low tire warning system have met with varying degrees of success. It has been found that the defects present in most prior radio circuits and methods for tuning radio circuits are such that the devices themselves are of limited economic and practical value when subjected to the strict requirements of the present invention.

Typical prior tunable radio circuits have employed inductive coil and slug sets, adjustable capacitors, and etching and abrading methods for setting the frequency of operation of the circuit. Such methods have failed to maintain the constant tuned frequency required when employed in a radio circuit mounted in a wheel rim cavity subjected to the normal operating conditions of an automobile wheel. Other ideas to force frequency stability have included adding circuit elements which tend to stabilize frequency. However, the circuit add-ons are relatively high cost items in comparison to the radio circuit itself and have also suffered the problems of adding weight and complicating the radio circuit.

The present invention contemplates a new and improved radio frequency circuit which overcomes the bulk of the above-referred to problems and others to provide a radio circuit which is simple in design, includes and adjustable circuit element for adjusting the frequency of operation of the circuit, avoids costly frequency stabilizing add-ons and provides a high degree of frequency stablility in a radio circuit regardless of the installation environment of the radio circuit.

SUMMARY OF THE INVENTION

In accordance with the present invention, there is provided a system for adjusting the frequency of operation of a radio frequency circuit comprising means for detecting a parameter relating to and representing the frequency of operation of a radio frequency circuit. A source of signals is provided representing a predetermined frequency of operation for the circuit. Control circuit means are coupled to the detector means and to the source to provide an output control signal when the detected frequency of operation bears a predetermined relationship to the predetermined frequency of operation. Adjustment means are provided including means for actuating the adjustment means coupled to the control circuit means and responsive to the control signal therefrom for adjusting the radio frequency circuit to the predetermined frequency of operation.

In accordance with another aspect of the present invention the adjustment means includes an adjustable inductor associated with the radio frequency circuit and including and exposed inductor portion coupled to means for varying the inductance of the inductor. The exposed inductor portion comprises a wire extending from a printed circuit board having in series with the inductor portion a foil loop portion. The foil loop portion and the wire comprise the adjustable inductor.

In accordance with a further aspect of the present invention, the means for actuating the adjustment means comprises a linear stepping motor associated with the wire for deforming the wire to vary the inductance of the adjustable inductor. The linear stepping motor is associated with the exposed inductor portion with a stepper slide and a movable plunger arm. When the frequency of operation of the radio circuit is higher than the predetermined frequency, the motor operates the slide and plunger arm to increase the inductance of the adjustable inductor by increasing the area enclosed by the inductive loop of the adjustable inductor. When the frequency of operation is lower than the predetermined frequency the motor, stepper slide and plunger arm operate to increase the frequency of operation by decreasing the inductance and accordingly the area enclosed by the inductive loop of the adjustable inductor.

In accordance with a more limited aspect of the present invention, computer means are provided for comparing the frequency of operation of the radio circuit with the predetermined frequency and for providing control signals to adjust the frequency of operation of the circuit.

One benefit obtained by use of the present invention is a radio circuit capable of maintaining a high degree of frequency stability.

Another benefit obtained from the present invention is a radio circuit which may withstand harsh environments and shocks typically present upon operation when mounted in a wheel rim cavity of an automobile wheel.

Another benefit obtained from the present invention is a system of tuning a radio frequency to fix the operational frequency to a predetermined frequency that is particularly susceptible to high volume production.

Other benefits and advantages for the subject new method and radio circuit will become apparent ot those skilled in the art upon a reading and understanding of the specification.

BRIEF DESCRIPTION OF THE DRAWINGS

The invention may take physical form in certain parts and arrangement of parts and certain steps and arrangements of steps, the preferred embodiments of which will be described in detail in the specification and illustrated in the accompanying drawings which form a part hereof and wherein:

FIG. 1 is a plan view of a radio frequency circuit formed in accordance with the present invention;

FIG. 2 is a perspective view of a portion of a radio circuit prior to tuning of the circuit in accordance with the practice of the present invention;

FIG. 3 is an elevated view of a radio frequency circuit mounted for adjustable tuning in accordance with the present invention;

FIG. 4 is a block diagram of a control system employed in tuning the radio frequency circuit; and, FIG. 5 is an end view of an actuator device and a portion of the radio frequency circuit being positioned for adjustable tuning in accordance with the present invention.

DETAILED DESCRIPTION OF THE PREFERRED EMBODIMENT

Referring now to the drawings wherein the showings are for purposes of illustrating the preferred embodiments of the invention only and not for purposes of limiting the same, the FIGS. show a radio circuit A to be particularly employed in a low tire warning system as a radio transmitter mounted in a cavity of a wheel rim of an automobile wheel. The components of circuit A are mounted on a circuit board comprising an etched printed circuit board 10 including foil conductors (not shown) for interconnecting the different components of the board. The circuit is largely a conventional radio transmitter including a dual bridge diode 12, diode 14 and zener diode 16. An integrated circuit 18 encodes the transmission to be made by the radio circuit A upon sensing of a low tire. Also included are transistor 20, resistors 22, 24, 26, 28 and capacitors 30, 32, 34, 36. Wire 40 comprises a preformed antenna coil and a portion of an inductive loop of an inductor of an LC tank circuit for the circuit A. The remaining portion of the inductive loop comprises a foil trace (not shown) on the printed circuit board 10 serially connected with the wire portion 40. Wire portion 40 extends from the surface of the board 10 to facilitate deformation of the wire portion 40 for frequency tuning as will hereinafter be more fully explained. Wire leads 42, 44 interconnect the radio circuit A with a source of electrical energy. A pressure switch (not shown) is associated with the radio circuit to initiate a transmission from the circuit A indicating a low tire condition in a wheel in which the circuit A is mounted.

In the preferred embodiment the circuit elements have the following specifications.

Resistor 22—1 megaohm, ¼ watt
Resistor 24—33 kiloohm, ¼ watt
Resistor 26—180 ohm, ¼ watt
Resistor 28—3.3 megaohm, ¼ watt
Capacitor 30—22 microfarads, 25 volts
Capacitor 32, 34—47 picofarads
Capacitor 36—10 picofarads
Zener diode 16—9.1 volts The integrated circuit encoder 18 is a conventional integrated circuit chip for encoding a specific control signal and may serve to identify a particular radio circuit from a particular wheel. The encoding process, and thus control signal, may be randomly specified by the manufacturer of the radio circuit A. With particular attention to FIG. 2, a portion of the radio circuit A is shown where wire portion 40 is shown in a pretuned configuration. As the wire 40 comprises an exposed inductor portion of the inductive loop of an LC tank circuit, adjusting the configuration of wire 40 will vary the area enclosed by the inductive loop thereby varying the inductance of the inductive loop. Reducing the area enclosed by the inductive loop will reduce the inductance of the inductive loop and accordingly increase the tuned frequency of operation of the radio circuit A. Conversely, adjusting the configuration of wire 40 to increase the area enclosed by the inductive loop will increase inductance and will accordingly decrease the tuned frequency of operation of the radio circuit.

The method of tuning the circuit A to a predetermined frequency comprises a closed loop feedback control system. The tuning is to be accomplished after attachment in a cavity of a wheel rim or upon a mounting stand constructed to provide the capacitive and inductive effects fo a wheel to which the radio circuit is attached, that is, tuning of circuit A is done prior to placing the circuit in actual operation. With reference to FIG. 4, a block diagram illustrating the operation of the system is provided. Upon the sensing of a low pressure condition, the raio circuit A transmits a transmission signal indicating a low tire to an associated local receiver in the automoblie. The signal may merely comprise a parameter relating to and representing the frequency of operation of the radio circuit. Pickup antenna 50 senses the transmitted signal from the circuit and transmits it to a radio frequency amplifier 52 for subsequent communication to a frequency counter 54. In combination, the amplifier 52 and counter 54 comprise a detecting device for detecting the frequency of operation of the circuit. A computer 56 includes a predetermined frequency setting which is compared with the detected frequency. Logic control circuitry is provided in computer 56 for automatically controlling a linear actuator device 58 which is coupled to wire portion 40 for adjustment of the configuration of the wire portion 40 dependent upon the relationship of the detected frequency to the predetermined frequency. An actuator interface 60 translates the control signals of the computer 56 into power control signal for operating the actuator 58. Preferably, actuator interface 60 includes switch means for communicating electrical energy to the acutator in a polarity for determining the operation of the actuator.

With reference to FIGS. 3 and 5, the actuator 58 preferrably comprises a linear stepping motor including a movable stepper slide arm 64 and a wire engagement member 66 at a terminal end of the arm for associative coupling with the wire portion 40. The wire engagement member 66 is slideably mounted on a guide track 68 and includes a plunger arm 70 received in plunger arm casing 72. A non-metallic receiving slot 74 having an opening generally normal to the direction of travel of the plunger arm 70 is provided at the terminal end of the plunger arm for engaging wire portion 40. Plunger arm 70 moves in a direction transverse to the movement direction of the stepper slide arm 64. In automatic operation of the invention the wire engagement member 66 is directed upon the wire portion 40 by a combination of movements of the plunger arm and stepper slide arm. More specifically, stepper slide arm 64 operates to position the slot 72 of the plunger arm 70 over wire portion 40. The plunger arm 70 is then operated to receive the wire portion 40 in a nesting reception in the slot. While positioned thus any movement of the stepper slide arm will cause consequent movement of the plunger arm and will adjust the configuration of the wire portion 40. After such nesting reception of the wire portion 40 in the wire engagement member 66, the frequency detecting device continues to monitor the transmitted frequency of the radio circuit A. Computer 56 upon comparing the detected frequency with the predetermined frequency provides an output control signal to adjust the configuration of the exposed inductor wire portion 40 to reduce the inductance of the inductive loop when the frequency detecting device continues to detect that the frequency of operation is lower than the preselected frequency. Reducing the inductance of the inductive loop comprises moving the wire engagement member 66 to reduce the area enclosed by the inductive loop and preferably comprises adjusting the configuration of the wire portion 40 to the generally serpentine configuration illustrated in FIG. 3. When the frequency detecting device detects that the frequency of operation is higher than the preselected frequency, the stepping motor is operated to adjust the configuration of the exposed inductor wire portion 40 to increase the inductance of the inductive loop. Increasing the inductance of the inductive loop comprises moving the engagement member in a direction away from the radio circuit device A to increase the area enclosed by the inductive loop.

In operation, the adjustment comprises relatively rapidly adjusting the configuration of the wire loop portion 40 until the detected frequency of the radio circuit A is adjusted to within 100 kilohertz of the preselected frequency. For example, a typical preselected tuned frequency would be 246 megahertz. After the detected frequency is within 100 kilohertz of the 246 megahertz the adjustment system will make a step adjustment, then uncouple and read the frequency of the operation. The system of the invention will tune the radio circuit A to within 50 kilohertz of the predetermined frequency.

The invention lends itself to high volume production in that the radio circuit may be tuned after attachment in a cavity of a wheel rim or upon a mounting stand constructed to provide the capacitive and inductive effect of a wheel to which the radio circuit is attached. The support stand 80 (FIG. 3) and guide track 68 support the actuator device 58 in a firm relationship relative to the radio circuit A to facilitate the precise adjustment deflections of wire portion 40 necessary to tune the radio circuit in the precise manner desired. It has been found that a radio circuit made in accordance with the present invention will maintain a high level of frequency stability even when subjected to radical temperature variations, heavy mechanical shocks and vibrations and intense air pressures.

The invention has been described with reference to the preferred embodiment. Obviously, modifications and alterations will occur to others upon the reading and understanding of the specification. It is our intention to include all such modifications and alterations insofar as they come within the scope of the dependent claims or the equivalence thereof.

Having thus described our invention, we now claim:

1. A method of tuning a radio frequency circuit including an inductive loop having an exposed inductor portion comprising:

detecting the frequency of operation of said circuit with a frequency detecting device;

associating said inductor portion with a selectively movable actuator device coupled to said frequency detecting device by nesting said inductor portion in a receiving slot of a movable plunger arm of said actuator device;

adjusting the configuration of said exposed inductor portion by moving said actuator device in response to control signals from said frequency detecting device whereby the inductance of said inductive loop and the frequency of operation are associatively varied;

fixing the configuration of said exposed inductor portion at a position of adjustment to determine the frequency of operation to be at a pre-selected frequency; and disassociating said inductor portion from said actuator device whereby said radio frequency circuit is tuned to the pre-selected frequency.

2. A method of tuning a radio frequency circuit including an inductive loop having an exposed inductor portion comprising:

detecting the frequency of operation of said circuit with a frequency detecting device;

associating said inductor portion with a selectively movable actuator device coupled to said frequency detecting device;

adjusting the configuration of said exposed inductor portion by moving said actuator device in response to control signals from said frequency detecting device whereby the inductance of said inductive loop and the frequency of operation are associatively varied;

fixing the configuration of said exposed inductor portion at a positon of adjustment to determine the frequency of operation to be at a pre-selected frequency wherein detecting the frequency of operation of said circuit comprises sensing a circuit parameter relating to and representing the carrier frequency of operation of said circuit, said frequency detecting device providing said control signals to said actuator device in associative response to the detected carrier frequency and adjusting the configuration of said exposed inductor portion comprises providing said control signals to a linear stepping motor of said actuator device, said linear stepping motor being associated with said exposed inductor portion with said actuator device including a stepper slide and a movable plunger arm, said stepping motor operating to adjust the configuration of said exposed inductor portion to reduce the inductance of said inductive loop when said frequency detecting device that the frequency of operation is higher than said pre-selected frequency and said stepping motor operating to adjust the configuration of said exposed inductor portion to increase the inductance of said inductive loop when said frequency detecting device detects that the frequency of operation is lower than said pre-selected frequency; and disassociating said inductor portion from said actuator device whereby said radio frequency circuit is tuned to the pre-selected frequency.

3. The method as claimed in claim 1 wherein said receiving slot extends transverse to an axis of said plunger arm.

4. The method as claimed in claim 3 wherein said plunger arm is transversely mounted to a stepper slide.

5. The method as claimed in claim 2 wherein reducing the inductance of said inductive loop comprises moving said plunger arm to reduce an area enclosed by said inductive loop and wherein increasing the inductance of said inductive loop comprises moving said plunger arm to increase the area enclosed by said inductive loop.

* * * * *